(12) United States Patent
Noda

(10) Patent No.: US 6,373,119 B1
(45) Date of Patent: Apr. 16, 2002

(54) SEMICONDUCTOR DEVICE AND METHOD OF MANUFACTURING THE SAME

(75) Inventor: Kenji Noda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/030,906

(22) Filed: Feb. 26, 1998

(30) Foreign Application Priority Data

Feb. 27, 1997 (JP) .............................................. 9-044134

(51) Int. Cl.[7] .......................... H01L 29/00; H01L 29/76
(52) U.S. Cl. ....................... 257/510; 257/344; 257/408; 257/513
(58) Field of Search ................................ 257/510, 374, 257/344, 408, 395, 396, 397, 506, 513, 524, 514, 515; 438/294, 296, 424, 425, 426, 427, 435, 576, 595, 303

(56) References Cited

U.S. PATENT DOCUMENTS

| 4,465,532 A | * | 8/1984 | Fukano ........................ 438/424 |
| 5,168,343 A | * | 12/1992 | Sakamoto .................... 257/513 |
| 5,357,133 A | * | 10/1994 | Morita ......................... 257/316 |
| 5,440,166 A | * | 8/1995 | Dixit et al. ................... 257/506 |
| 5,614,430 A | * | 3/1997 | Liang et al. ................. 438/291 |
| 5,804,862 A | * | 9/1998 | Matumoto ................... 257/395 |
| 5,831,305 A | * | 11/1998 | Kim ............................. 257/344 |

FOREIGN PATENT DOCUMENTS

| JP | 58-9333 | | 1/1983 |
| JP | 62-190847 | | 8/1987 |
| JP | 62190847 | | 8/1987 |
| JP | 402113548 | * | 4/1990 |
| JP | 2-303049 | * | 12/1990 |
| JP | 5- 21591 | | 1/1993 |
| JP | 5- 21592 | | 1/1993 |

* cited by examiner

*Primary Examiner*—Steven Loke
*Assistant Examiner*—Hung Kim Vu
(74) *Attorney, Agent, or Firm*—Sughrue Mion, PLLC

(57) ABSTRACT

A semiconductor device including a trench element separation structure and adapted to a high degree of integration without having crystal defects produced in a semiconductor substrate, and a method of manufacturing the same. The semiconductor device includes a trench element separation region in a prescribed region of the semiconductor substrate, the wall of the semiconductor substrate which forms an inside surface of a trench is covered with a first insulation film, and a second insulation film and a third insulation film are filled inside the trench being stacked in layers in this order. Or, the semiconductor device includes a trench element separation structure in the prescribed region of the semiconductor substrate of one conduction type, the wall of the semiconductor substrate which forms an inside surface of a trench is covered with a first insulation film, and a second insulation film is filled inside the trench which is covered with the first insulation film, and a diffusion layer of a reverse conduction type is formed on the surface of the semiconductor substrate which forms the side surface of the upper region of the trench.

10 Claims, 8 Drawing Sheets

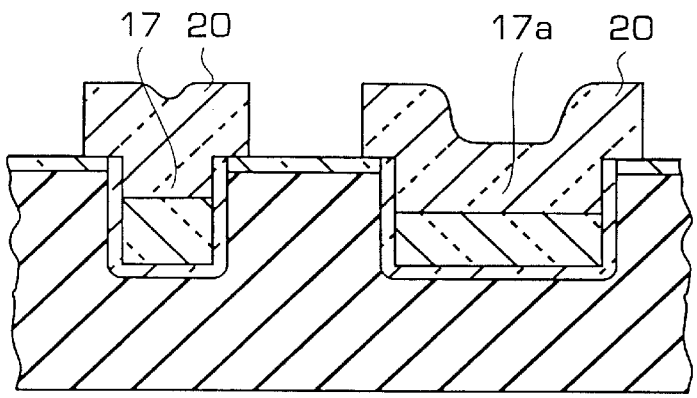
FIG. 6A
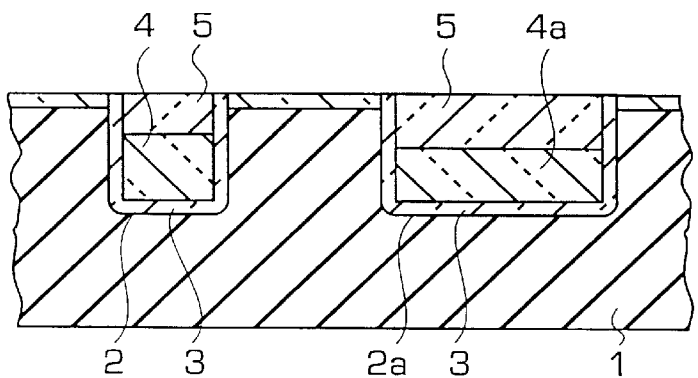
FIG. 6B
FIG. 7
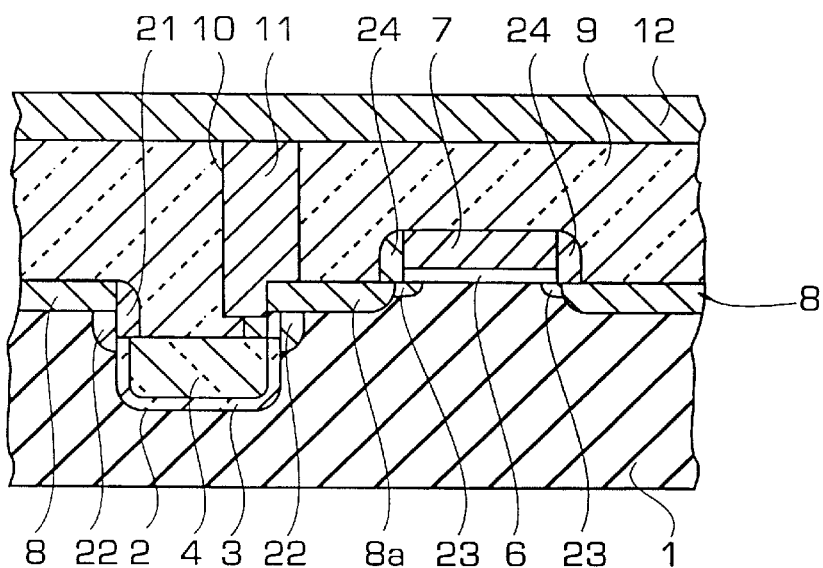

SEMICONDUCTOR DEVICE AND METHOD OF MANUFACTURING THE SAME

BACKGROUND OF THE INVENTION

1. Field of the invention

The present invention relates to a semiconductor device and a method of manufacturing the same, more particularly to a semiconductor device comprising a trench element separation structure and a method of manufacturing the same.

2. Description of the Related Art

Hitherto, a LOCOS (Local Oxidation of Silicon) method has been used for forming an element separation region of a semiconductor device; however, for the purpose of producing a highly integrated semiconductor device, a method including a trench dug in a semiconductor substrate for filling an insulation film therein has also been used as a candidate method that replaces the LOCOS method, which needs a wide extent in the transverse direction. However, when the trench is buried with a material such as a silicon oxide film similar to an interlayer insulation film, it is necessary to ensure a sufficient margin, as described below, for mask alignment of a diffusion layer and a contact portion, and this has been an obstacle to improving the degree of integration.

A prior art in which a trench is dug in the semiconductor substrate to embed an insulation film therein (hereinafter this art will be referred to as a first prior art example) will be described with reference to FIG. 1A and FIG. 1B. FIG. 1A is a sectional view of an insulated gate field effect transistor (hereinafter referred to as a MOS transistor) having a trench element separation structure of the first prior art example.

As shown in FIG. 1A, element separation trench 102 for element separation use is formed in silicon substrate 101, and then the trench is filled with a $SiO_2$ film according to a chemical vapor deposition (CVD) method to form filling insulation film 103. Then in accordance with a manufacturing process of a normal MOS transistor, gate insulation film 104, gate electrode 105, source/drain region 106, 106a and interlayer insulation film 107 comprising a $SiO_2$ made by a CVD method are formed on the silicon substrate.

Next, contact hole 108 for connecting the wiring is formed in source/drain region 106a, and contact plug 109 is filled in the contact hole 108. Subsequently, wiring 110 laid on interlayer insulation film 107 and contact plug 109 are connected.

In case of forming this contact hole 108, it is usual to provide a design margin X of a fixed value between contact hole 108 and element separation trench 102 giving consideration to mask alignment leeway between source/drain region 106a and contact hole 108. If the margin X is insufficient and positional misalignment of the mask takes place, as shown in FIG. 1B, contact hole 108a is formed partially overlapping with element separation trench 102. At the time when the contact hole is formed, etching time is usually set with a 30 to 100% margin over an expected normal time considering the influence of the dispersion of data such as the film thickness of interlayer insulation film 107 or the etching speed which is to be generated during a manufacturing process. If filling insulation film 103 filling element separation trench 102 and interlayer insulation film 107 are formed with the same material and the value of the margin X is insufficient, contact hole 108a formed by etching will dig filled insulation film 103.

In such a state, contact plug 109 filled in contact hole 108a will come to be connected with silicon substrate 101 at an exposed side wall of element separation trench 102. This contact plug 109 also connects with source/drain region 106a. Since silicon substrate 101 and source/drain region 106a are short-circuited as described above, the MOS transistor will fail to operate normally. A MOS transistor of FIG. 1B comprises gate insulation film 104, gate electrode 105 and source/drain regions 106, 106a in the same manner as that of FIG. 1A.

An invention developed for overcoming this kind of drawback is disclosed in Japanese Patent Laid-open Gazette 190847/1987 (hereinafter this art is referred to as a second prior art example). FIG. 2 is a sectional view of a MOS transistor having a trench element separation structure of the second prior art example.

On the surface of element separation trench 202 formed in silicon substrate 201, there is formed silicon nitride film 203 of several tens of nm in thickness, and the remaining part inside the trench is filled with filling insulation film 204. On the surface of silicon substrate 201 where no element separation structure is formed, gate insulation film 205, gate electrode 206 and source/drain region 207, 207a of the MOS transistor are formed, and interlayer insulation film 208 composed of an oxide film is formed thereon covering all the silicon substrate 201.

In the manufacturing process of the second prior art example, when contact hole 209 for connecting wiring is formed in source/drain region 207a and then wiring 211 laid on the interlayer insulation film is connected with source/drain region 207a of the MOS transistor under the condition that the mask alignment margin between source/drain region 207a and contact hole 209 is insufficient, it is probable that the contact hole will be formed partially overlapping with the element separation region. However, even in such a case, a silicon substrate on the side wall of element separation trench 202 is protected by silicon nitride film 203 because the etching speed of silicon nitride film 203 is slow compared with that of a silicon oxide film which constitutes interlayer insulation film 208. Consequently, there is no probability of a short circuit occurring between wiring 211 and silicon substrate 201.

Certainly, the second prior art example can solve the technical problem of the first prior art example. However, there is another problem in the technique of the second prior art example in that, since silicon nitride film 203 is directly deposited on the surface of a silicon substrate inside element separation trench 202 formed in silicon substrate 201, a crystal defect is generated in an area near the silicon substrate surface facing element separation trench 202 which is caused by thermal changes produced in the following processes, thereby causing an increase in the leak current which flows from a diffusion layer that constitutes source/drain region 207a to silicon substrate 201.

This is because the elastic strength of silicon nitride film 203 is remarkably large compared with that of the silicon oxide film, and hence when thermal changes are applied to silicon nitride film 203 after being deposited on the silicon substrate, thermal stress is produced within the silicon, thereby causing crystal defects.

Leak current of this kind carried from the diffusion layer to the silicon substrate functions not only to increase dissipation power during the operation waiting time of the semiconductor device, but to induce a latch-up phenomenon in the semiconductor device of a CMOS structure, thereby becoming a large cause of deteriorating the reliability of the product.

SUMMARY OF THE INVENTION

An object of the present invention is to provide a semiconductor device having a trench element separation structure and adapted to a high degree of integration while solving the technical problems of the prior art without having crystal defects produced in the silicon substrate, and a method of manufacturing the same.

Therefore, the semiconductor device of the present invention has a trench element separation region in a fixed region of the semiconductor substrate, the inside wall of the trench is covered with a first insulation film, and a second insulation film and a third insulation film are stacked in layers in this order and filled on the first insulation film in the trench.

Here, the third insulation film is formed so that the surface thereof may be positioned lower than the surface of the semiconductor substrate.

Further, an interlayer insulation film is formed so that it may cover the third insulation film and the semiconductor substrate, the interlayer insulation film is composed of a silicon oxide film and the third insulation film is composed of one of a silicon oxynitride film or a silicon nitride film, a silicon oxide film including excess silicon.

The semiconductor device according to another aspect of the present invention has a trench element separation region in a prescribed region of the semiconductor substrate of one conduction type, the inside wall of the trench is covered with the first insulation film, the second insulation film is filled on the first insulation film, and a diffusion layer of reverse conduction type is formed on the semiconductor substrate on the side wall of the upper region which constitutes an opening portion of the trench.

Here, a side wall insulation film is formed on the side wall of the opening portion of the aforementioned trench.

Now, a method of manufacturing the semiconductor device of the present invention comprises the steps of forming a trench on one main surface of the semiconductor substrate, thermally oxidizing an inside wall of said trench, filling the inside of said trench with a filling insulation film composed mainly of a silicon dioxide, etching back the filling insulation film to a level lower than the main surface of said semiconductor substrate, and filling the opening portion of said trench with a cap insulation layer composed mainly of a silicon nitride.

Here, the step of filling the opening portion of said trench with the cap insulation layer composed mainly of a silicon nitride comprises the steps of forming the insulation film composed mainly of a silicon nitride by attaching the insulation film so as to cover the opening portion of said trench, forming a resist pattern arranged to mask the opening portion of said trench, applying anisotropic etching to said insulation film using said resist pattern as a mask, removing said resist pattern, and removing a remained part of said insulation film positioned higher than the surface of said semiconductor substrate by a chemical polishing method.

A method of manufacturing the semiconductor device according to another aspect of the present invention comprises the steps of forming a trench in one main surface of the semiconductor substrate of one conduction type, thermally oxidizing the inside wall of the trench, filling the inside of the trench with the filling insulation film composed mainly of a silicon dioxide, etching back the filling insulation film to a level lower than the main surface of the semiconductor substrate, and forming the diffusion layer of a reverse conduction type on the exposed part of the main surface of the semiconductor substrate and the exposed part of the trench side wall.

A method of manufacturing the semiconductor device according to still another aspect of the present invention comprises the steps of forming a trench in one main surface of the semiconductor substrate of one conduction type, thermally oxidizing the inside wall of the trench, filling the inside of the trench with the filling insulation film composed mainly of a silicon dioxide, depositing an interlayer insulation film in such a manner that it covers the filling insulation film and thereafter forming a contact hole which penetrates the interlayer insulation film, and ion implanting impurities of a reverse conduction type through said contact hole into one main surface of the semiconductor substrate and the semiconductor substrate on the side wall of the trench both exposed by forming said contact hole.

Here, it is preferable to perform the ion implantation of impurities of the reverse conduction type by a rotational oblique ion implantation method.

In the semiconductor device of the present invention, the cap insulation layer formed in the opening portion of the trench prevents the filling insulation film from being etched at the time of forming the contact hole.

In the semiconductor device according to another aspect of the present invention, even when the filling insulation film is etched and a side wall of the trench is exposed at the time when the contact hole is formed, since the diffusion layer is formed on the exposed region of the semiconductor substrate, the conductive material filled in the contact hole and the semiconductor substrate do not contact with each other even if the contact hole is formed partially overlapping with the trench.

Further, since the insulation film of small thermal stress is embedded in the greater part of the inside of the trench which constitutes the trench element separation region, the thermal stress of the semiconductor substrate becomes small and hence the emergence of the crystal defect is considerably controlled.

The above and other object, features, and advantages of the present invention will become apparent from the following description based on the accompanying drawings which illustrate an example of a preferred embodiment of the present invention.

BRIEF DESCRIPTION OF THE DRAWINGS

FIG. 6A is a sectional view showing a ninth manufacturing process of the semiconductor device of FIG. 3.

FIG. 6B is a sectional view showing a tenth manufacturing process of the semiconductor device of FIG. 3.

FIG. 7 is a vertical sectional view of an N channel type MOS transistor of a semiconductor device according to a second embodiment of the present invention.

DETAILED DESCRIPTION OF THE PREFERRED EMBODIMENTS

Figure 1A:
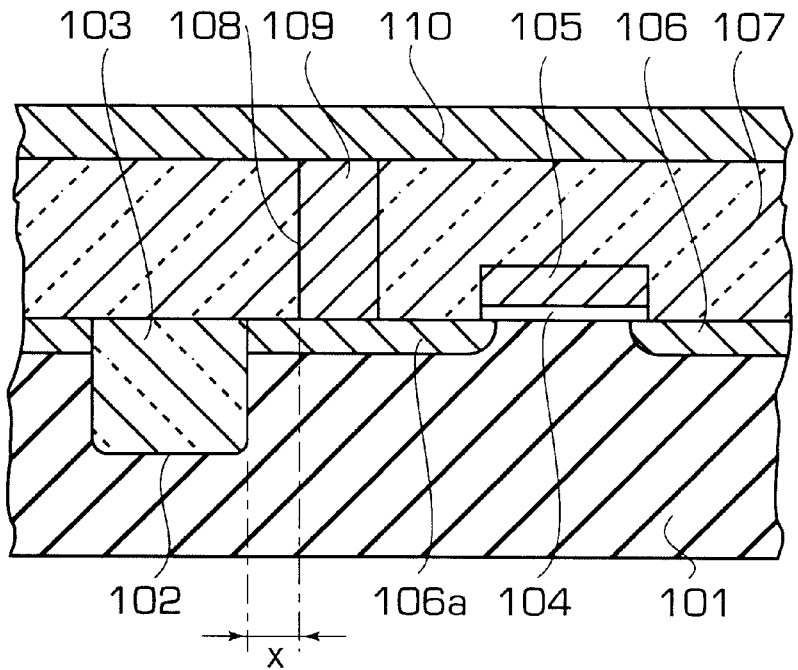
FIG. 1A is a sectional view of a MOS transistor of a semiconductor device including a trench element separation structure according to a first prior art example.
Figure 1B:
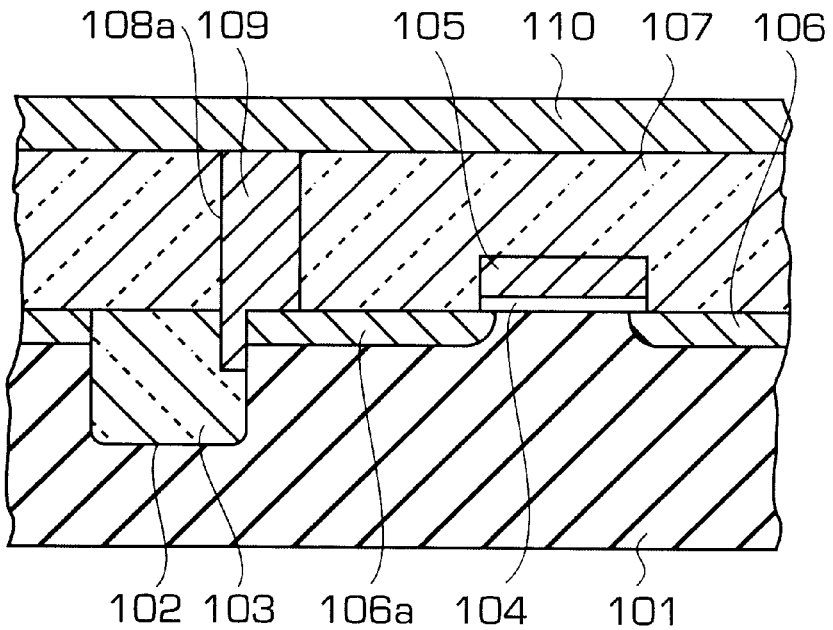
FIG. 1B is a sectional view of the MOS transistor of the semiconductor device including the trench element separation structure according to the first prior art example, when the mask misalignment is generated with reference to a contact hole.
Figure 2:
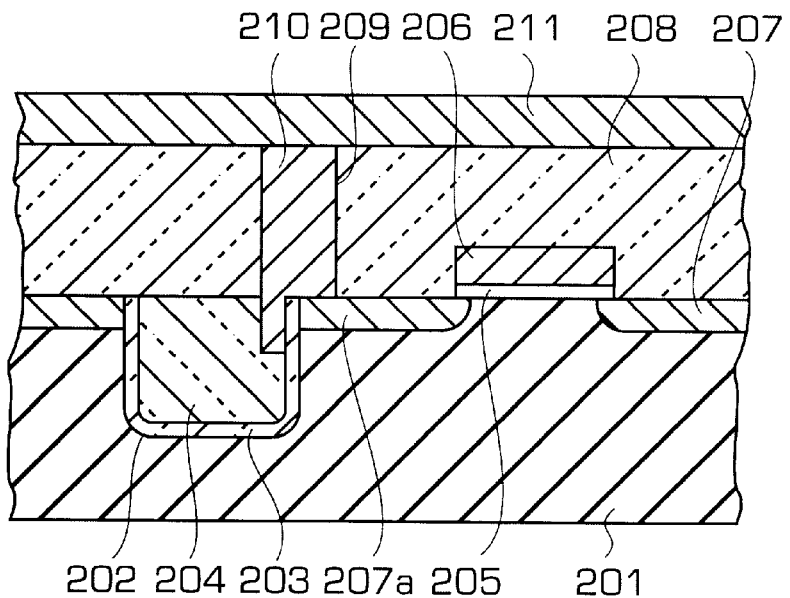
FIG. 2 is a sectional view of a MOS transistor including a trench element separation structure according to a second prior art example.
Figure 3:
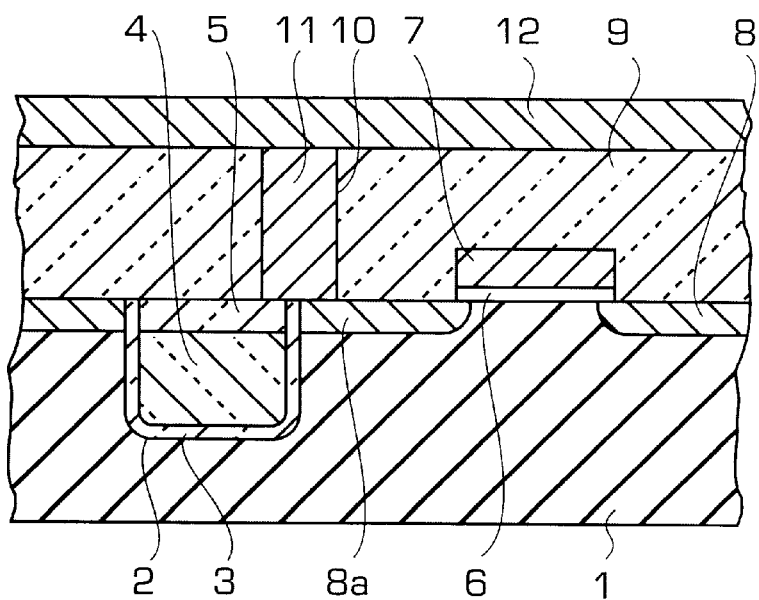
FIG. 3 is a vertical sectional view of an N channel type MOS transistor of a semiconductor device according to a first embodiment of the present invention.

Next, a first embodiment of the present invention will be described with reference to FIG. 3 to FIG. 6. FIG. 3 is a vertical sectional view of an N channel type MOS transistor of a semiconductor device according to a first embodiment of the present invention. Further, each of FIGS. 4A to 4D, FIGS. 5A to 5D and FIGS. 6A, 6B is a sectional view showing various steps of the manufacturing process of a semiconductor device of FIG. 3 in the order of the manufacturing process.

As shown in FIG. 3, on the surface of element separation trench 2 which is formed in silicon substrate 1 of a P conductive type for the purpose of element separation, thermal oxidation film 3 is formed as a first insulation film. In the inside of element separation trench 2, filling insulation film 4 made of a silicon oxide film is filled in by a CVD method. Further, cap insulation layer 5 comprising a silicon nitride film and the like is embedded in such a manner to cover filling insulation film 4 which constitutes a second insulation film. Cap insulation film 5 serves as a third insulation film.

On the surface of silicon substrate 1, other than in the element separation region, gate electrode 7 is formed sandwiching gate insulation film 6 in the same way as in a common MOS transistor, and high concentration impurity diffusion layer 8, 8' which serves as the source/drain region of the MOS transistor is also formed. Further, on the MOS transistor built on the surface of silicon substrate 1, interlayer insulation film 9 composed mainly of a silicon oxide film is formed.

Then, an opening is provided in a prescribed region of interlayer insulation film 9 to form a contact hole 10 which reaches high concentration impurity diffusion layer 8a. Further, contact plug 11 fills this contact hole 10 is connected with wiring 12.

Next, a method of manufacturing a trench element separation structure of this kind will be described with reference to FIGS. 4A to 4D, FIGS. 5A to SD and FIGS. 6A, 6B.

Figure 4A:
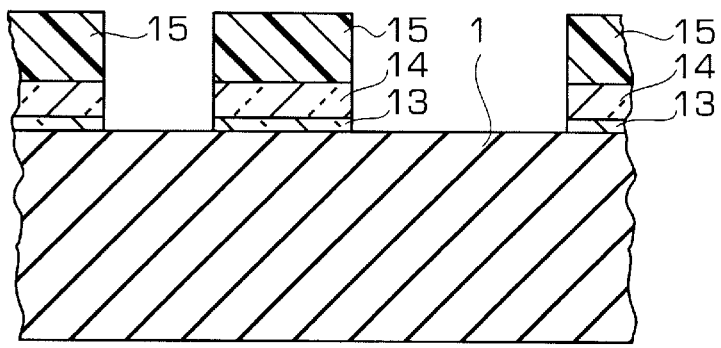
FIG. 4A is a sectional view showing a first manufacturing process of the semiconductor device of FIG. 3.

First, as shown in FIG. 4A, first protective insulation film 13 and second protective insulation film 14 are selectively formed in layers on the surface of silicon substrate 1. Here, first protective insulation film 13 is a silicon oxide film of about 5 to 50 nm thick formed through thermal oxidation, and second protective insulation film 14 is a silicon nitride film of about 50 to 100 nm thick formed by a CVD method. These insulation films are then processed by patterning to a desired configuration with a dry etching technique while using resist mask 15 prepared by a photolithograph technique.

Figure 4B:
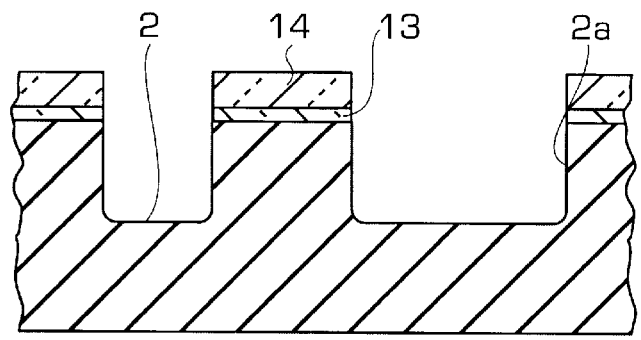
FIG. 4B is a sectional view showing a second manufacturing process of the semiconductor device of FIG. 3.
Figure 4C:
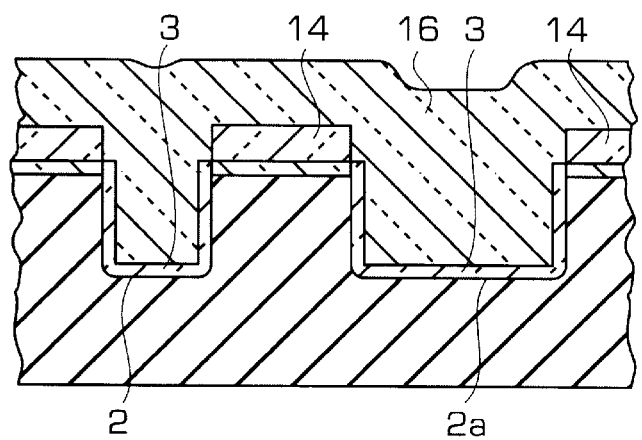
FIG. 4C is a sectional view showing a third manufacturing process of the semiconductor device of FIG. 3.

Next, as shown in FIG. 4B, element separation trench 2, 2a is formed on silicon substrate 1 by anisotropic etching using first protective insulation film 13 and second protective insulation film 14 as the etching mask. Then, as shown in FIG. 4C, thermal oxidation film 3 is built by thermally oxidating the surface of element separation trench 2, 2a by using second protective insulation film 14 as an oxidation mask. Here, thermal oxidation film 3 is built so that its thickness is in a range of 5 to 20 nm. It is known that, when element separation trench 2, 2a is formed by dry etching of the surface of silicon substrate 1 in such a manner that the bottom size becomes smaller than the opening size, the trench can easily be filled without having any voids in the insulation film which may be generated during the later element separation trench filling process and the insulation film forming process.

Then, as shown in FIG. 4C, insulation film 16 for filling use is deposited on the whole surface by a bias-ECR-CVD method, and then heat treatment is applied to insulation film 16 at a temperature of about 900° C.

Figure 4D:
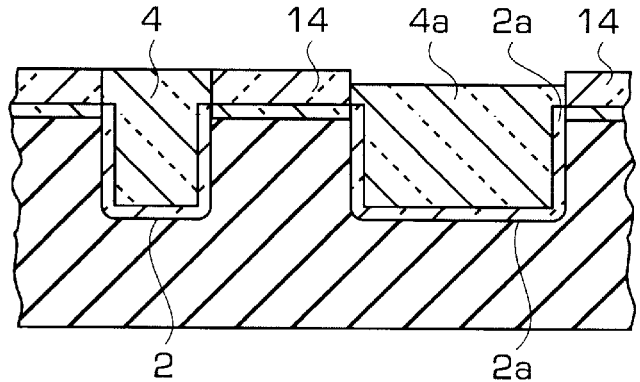
FIG. 4D is a sectional view showing a fourth manufacturing process of the semiconductor device of FIG. 3.

Then, as shown in FIG. 4D, filling insulation film, 4a is formed by polishing and removing filling insulation film 16 by a CMP (Chemical Mechanical Polishing) method. During this process, second protective insulation film 14 made of a silicon nitride film functions as an etching stopper, because the polishing speed of second protective insulation film 14 is smaller than that of the filling insulation film 16 which is the silicon oxide film.

Further, in case the element separation trench is coarse or fine in pattern as shown in FIG. 4D, the amount of filling insulation film 16 to be polished off usually becomes large for a wide trench than a narrow trench. In other words, the surface of filling insulation film 4a to be filled in element separation trench 2a of a wide width becomes, after the CMP treatment, lower in height than the surface of filling insulation film 4 to be filled in element separation trench 2 of a narrow width.

Figure 5A:
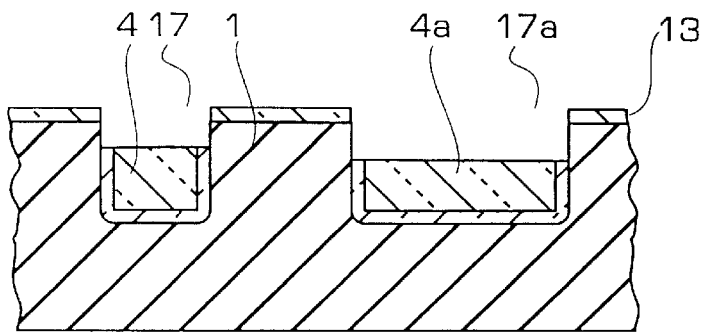
FIG. 5A is a sectional view showing a fifth manufacturing process of the semiconductor device of FIG. 3.

Then, as shown in FIG. 5A, the surface of filling insulation film 4, 4a is etched by wet etching using a dilute fluoric acid group etching liquid. Through this etching back process, the surface height of filling insulation film 4, 4a is reduced so that it may become lower than the surface of silicon substrate 1 by about 50 to 200 nm. After hollow portion 17, 17a is formed in this way, second protective insulation film 14 is completely removed to expose first protective insulation film 13.

Figure 5B:
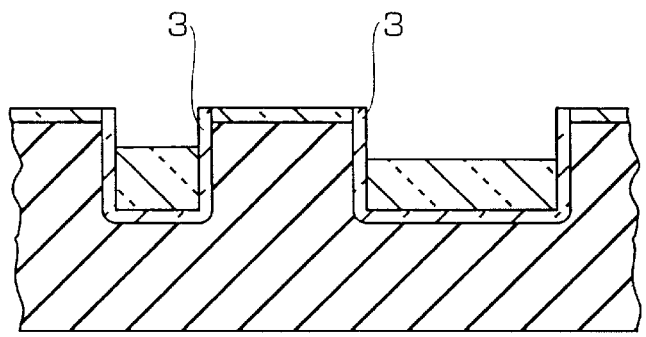
FIG. 5B is a sectional view showing a sixth manufacturing process of the semiconductor device of FIG. 3.

Then, as shown in FIG. 5B, by thermally oxidizing the surface of silicon substrate 1, thermal oxidation film 3 is again formed on the upper part of element separation trench 2, 2a exposed by the etching back process shown in FIG. 5A.

Figure 5C:
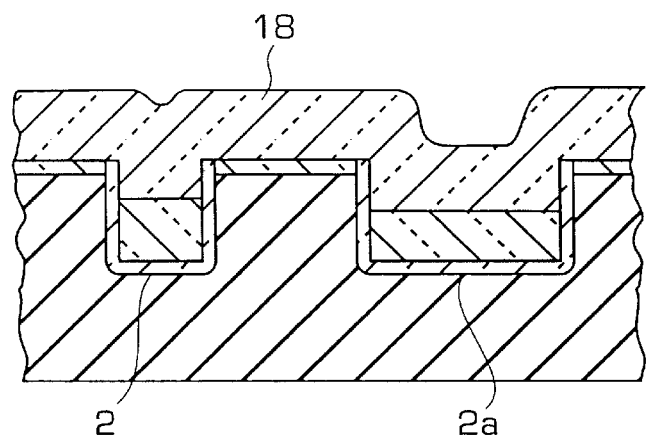
FIG. 5C is a sectional view showing a seventh manufacturing process of the semiconductor device of FIG. 3.

Then, as shown in FIG. 5C, hollow portion 17, 17a of the opening of element separation trench 2, 2a is completely filled by cap insulation film 18 of about 200 nm thick deposited by such as a CVD method so that cap insulation film 18 may cover the whole surface of silicon substrate 1. Here, a silicon oxynitride film, or a silicon oxide film with excess silicon or a silicon nitride film is used for cap insulation film 18, where the silicon oxide film including excess silicon means a silicon dioxide film which contains more silicon more than a stoichiometric silicon quantity by 5 to 10 atom percent of silicon atoms.

Figure 5D:
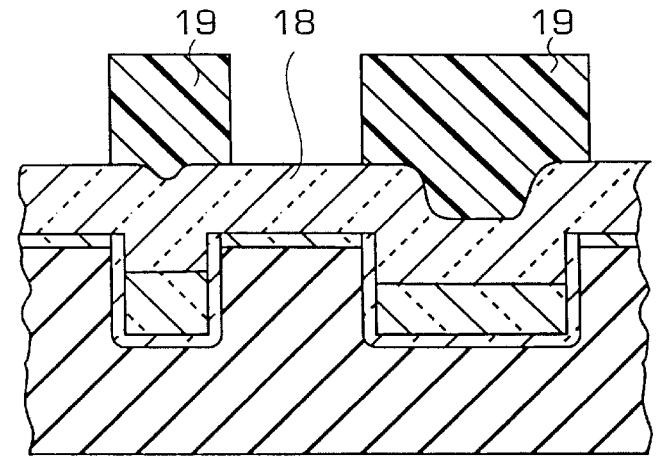
FIG. 5D is a sectional view showing a eighth manufacturing process of the semiconductor device of FIG. 3.

Next, as shown in FIG. 5D, resist masks 19 are formed on cap insulation film 18. Here, respective patterns of resist masks 19 are made by using respective inversion masks of patterns of element separation trenches 2, 2a.

Then, as shown in FIG. 6A, cap insulation film 18 is processed by patterning through anisotropic etching by using resist mask 19 as the etching mask. At this time, projection 20 which is practically thick is produced at the end of element separation trench 2, 2a or at a position where the trench width is narrow.

Then, as shown in FIG. 6B, projection 20 is polished by the CMP method, materials other than the cap insulation films filled in hollow portions 17, 17a are removed to flatten the surface of the silicon substrate. Cap insulation films 5 are formed in this way.

As described above, trench element separation regions of different opening dimensions are formed in the prescribed region on the surface of silicon substrate 1. In other words, thermal oxidation film 3 is formed on the inside wall of element separation trench 2, 2a, filling insulation film 4, 4a is filled in the lower region of element separation trench 2, 2a on thermal oxidation film 3 formed in the trench, and cap insulation film 5 is filled in the upper region of the trench on insulation film 4, 4a.

In case of forming the MOS transistor including the trench element separation region as shown in FIG. 3, gate insulation film 6, gate electrode 7, high concentration impurity diffusion layer 8, 8a, interlayer insulation film 9, contact hole 10, contact plug 11 and wiring 12 are formed thereafter according to the conventional manufacturing method.

Here, when the opening for contact hole 10 is produced, the interlayer insulation film is etched under the condition in which the etching speed of interlayer insulation film 9 is greater than the etching speed of cap insulation layer 5, that is, the interlayer insulation film is etched with the dry etching condition of the high etching selection ratio. Therefore, a mixed gas of $CH_2F_2$ and CO is used as the dry etching gas.

When the trench element separation structure of this kind is used, the wiring and the silicon substrate are not short-circuited even when contact hole 10 is provided partially overlapping with the element separation trench and the inside of the element separation trench is dug. Further, since the oxidation film is filled in the greater part of the inside of the element separation trench which serves as the element separation region and moreover the thermal oxidation film is placed between the cap insulation layer and the silicon substrate, the thermal stress of the silicon substrate is controlled to a reduced value and hence there is little probability of producing crystal defects.

According to the manufacturing method of the present invention, since cap insulation layer 5 can be embedded in the element separation trench as shown in FIG. 3, the surface under the gate electrode can be made flat. Accordingly, in the photolithograph process to be conducted for patterning of the gate electrode, it becomes possible to control the influence of such as the change of the resist thickness or halation to the minimum and perform the further delicate processing.

Then, a second embodiment of the present invention will be described with reference to FIG. 7, FIGS. 8A to 8D and FIGS. 9A, 9B.

FIG. 7 is a vertical cross sectional view of an N channel type MOS transistor of a semiconductor device according to a second embodiment of the present invention. FIGS. 8A to 8D and FIGS. 9A, 9B are sectional views showing the manufacturing process of FIG. 7 in the order of the manufacturing process. Here, the same item as that of the first embodiment is represented with the same symbol.

As shown in FIG. 7, filling insulation film 4 is filled in a deep lower region 10 to 100 nm from the surface of element separation trench 2 formed in P type conductive silicon substrate 1, and thermal oxidation film 3 is placed between filling insulation film 4 and the surface of silicon substrate 1 which forms element separation trench 2. On the side wall of the remaining upper region, insulation film spacer 21 is formed as a side wall insulation film. On the side of silicon substrate 1 of the upper region which constitutes the opening portion of element separation trench 2, there is provided low concentration impurity diffusion layer 22.

On the surface of silicon substrate 1 other than the trench element separation region, gate electrode 7 is formed sandwiching gate insulation film 6 in the same manner as the common MOS transistor, and on the side of gate electrode 7, there is formed insulation film spacer 24 which is made of a silicon oxide film. Also, a LDD (Lightly Doped Drain) structure is built by low concentration impurity diffusion layer 23 and high concentration impurity diffusion layer 8, 8a which serves as the source/drain region of the MOS transistor. Here, low concentration impurity diffusion layer 22 is formed in the side of element separation trench 2, the side being in the region deeper than high concentration impurity diffusion layer 8a. Accordingly, the depth of the diffusion layer near the side of element separation trench 2 is practically. deeper than the diffusion layers in other regions.

On the MOS transistor formed on silicon substrate 1, interlayer insulation film 9 composed mainly of the silicon oxide film is formed, and on interlayer insulation film 9, there is provided wiring 12. Contact plug 11 for connecting high concentration impurity diffusion layer 8a and wiring 12 through interlayer insulation film 9 is filled in contact hole 10.

A manufacturing method for realizing the structure such as mentioned above will next be described with reference to FIGS. 8A to 8D and FIGS. 9A, 9B.

Figure 8A:
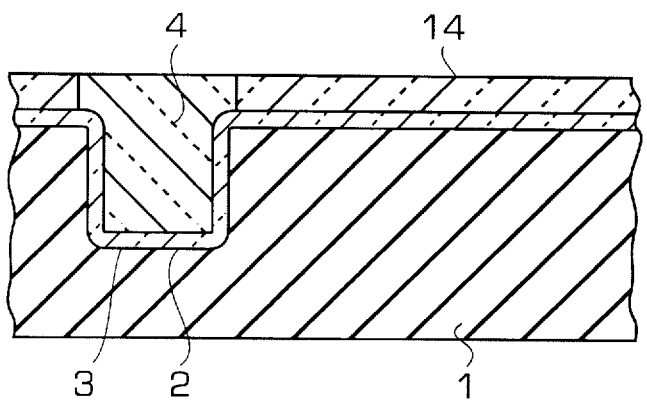
FIG. 8A is a sectional view showing a first manufacturing process of the semiconductor device of FIG. 7.

First, in the same way as described in the first embodiment, element separation trench 2 processed through patterning is formed in the prescribed region of the surface of silicon substrate 1, and then thermal oxidation film 3 is formed on the inside wall of element separation trench 2 and on the surface of silicon substrate 1. Next, filling insulation film 4 is filled inside element separation trench 2 by a CMP method using second protective insulation film 14 as the etching stopper. FIG. 8A is a sectional view showing the state at this time.

Figure 8B:
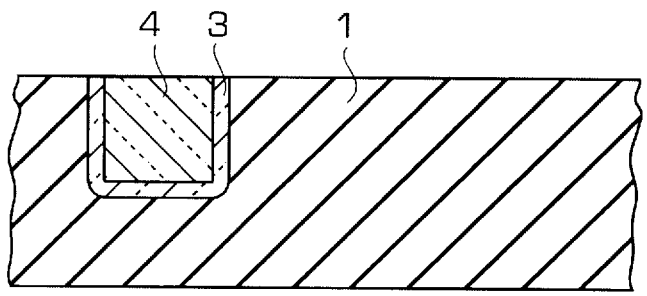
FIG. 8B is a sectional view showing a second manufacturing process of the semiconductor device of FIG. 7.

Subsequently, as shown in FIG. 8B, second protective insulation film 14 and thermal oxidation film 3 on the surface of silicon substrate 1 are removed by wet etching after filling insulation film 4 is etching backed. Then, it is preferable to design the amount of etching back so that thermal oxidation film 3 and filling insulation film 4 may be obtained as much as possible at the same height as the surface of the silicon substrate, but it is acceptable even if filling insulation film 4 becomes lower than thermal oxidation film 3.

Figure 8C:
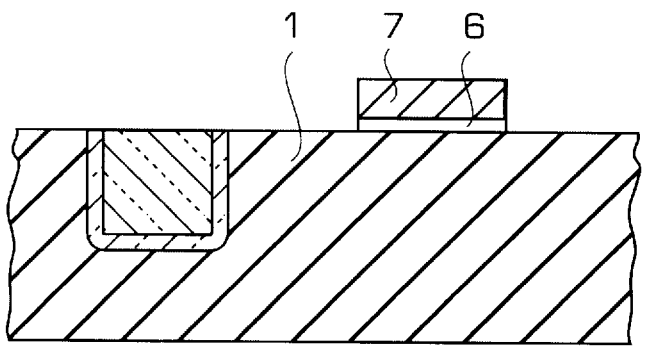
FIG. 8C is a sectional view showing a third manufacturing process of the semiconductor device FIG. 7.

Then, as shown in FIG. 8C, gate insulation film 6 and gate electrode.7 are formed on the main surface of silicon substrate 1.

Figure 8D:
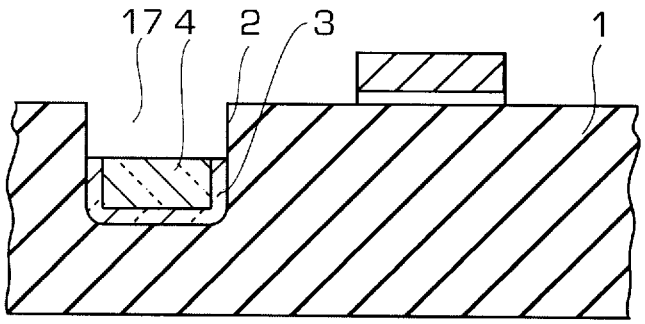
FIG. 8D is a sectional view showing a fourth manufacturing process of the semiconductor device of FIG. 7.

After then, as shown in FIG. 8D, filling insulation film 4 filled in element separation trench 2 and thermal oxidation film 3 grown on the inside wall of the same trench are etched to the level where their surfaces are lower than the surface of silicon substrate 1, thereby forming hollow portion 17.

Figure 9A:
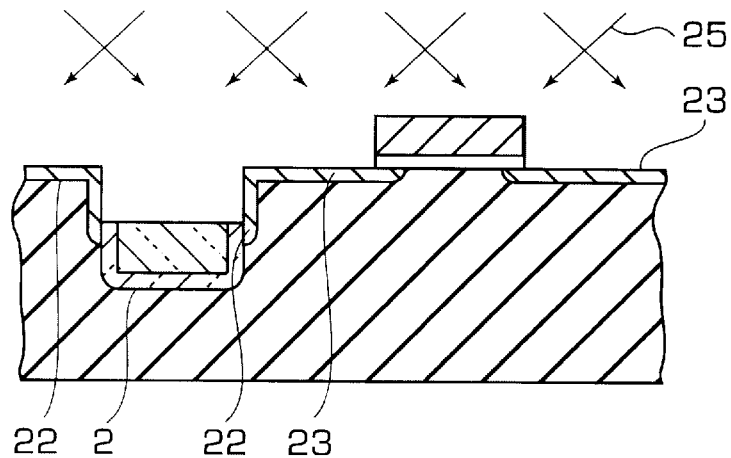
FIG. 9A is a sectional view showing a fifth manufacturing process of the semiconductor device of FIG. 7.

Then, as shown in FIG. 9A, impurity ions 25 of arsenic or phosphorus are implanted with a rotational oblique ion implantation method on the whole surface at a dosage on the order of $1 \times 10^{13}$ ion/cm$^2$ to $1 \times 10^{15}$ ion/cm$^2$ in order to form low concentration impurity diffusion layers 23, 22 on the main surface of exposed silicon substrate 1 and on the side of the exposed upper region of element separation trench 2, respectively.

Figure 9B:
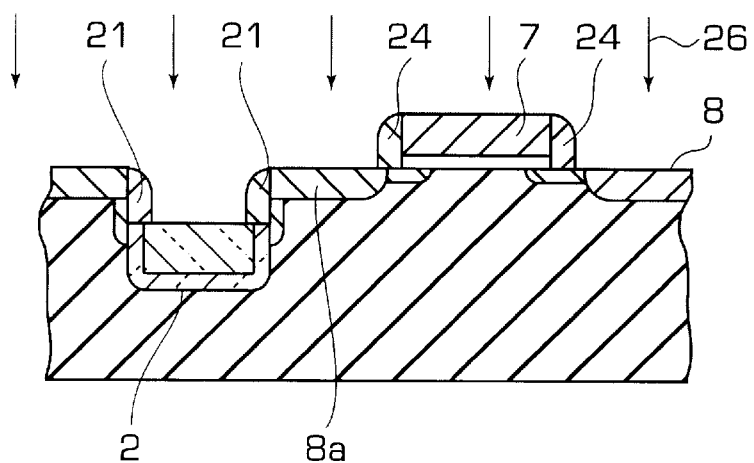
FIG. 9B is a sectional view showing a sixth manufacturing process of the semiconductor device of FIG. 7.

Next, as shown in FIG. 9B, after depositing the silicon oxide film on the whole surface by a CVD method, anisotropic etching is applied to form insulation film spacers 24, 21 on the side wall of gate electrode 7 and on the side wall of the exposed upper region which constitutes the opening portion of element separation trench 2, respectively. After that, impurity ions 26 such as arsenic are again implanted on the whole surface at a dosage in a range of $1 \times 10^{15}$ ion/cm$^2$ to $1 \times 10^{16}$ ion/cm$^2$ and heat-treated to form high concentration impurity diffusion layer 8, 8a which constitutes the source/drain region of the MOS transistor.

Thereafter, according to the conventional manufacturing method, interlayer insulation film 9, contact hole 10, contact plug 11 and wiring 12 are formed as shown in FIG. 7.

When this kind of the trench element separation structure is employed, even if contact hole 10 is formed partially overlapping with element separation trench 2 and the insulation film within element separation trench 2 is etched, contact plug 11 is allowed to contact low concentration impurity diffusion layer 22 provided on the side of the upper region of element separation trench 2. Therefore, there is no probability of having the aforementioned short circuit which may take place between silicon substrate 1 and contact plug 11.

Further, an insulation film which generates a large thermal stress is not filled in element separation trench 2 which serves as the element separation region. Therefore, when compared with the first embodiment, the thermal stress generated in silicon substrate 1 becomes smaller and the probability of generation of crystal defects is reduced remarkably.

Figure 10A:
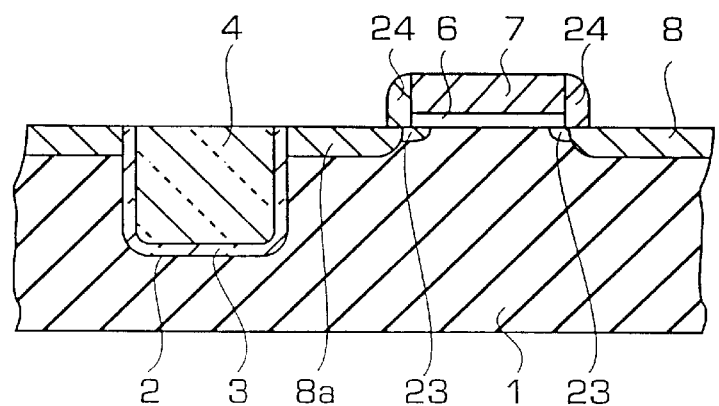
FIG. 10A is a sectional view showing a first manufacturing process of an N channel type MOS transistor of a semiconductor device according to a third embodiment of the present invention.
Figure 10B:
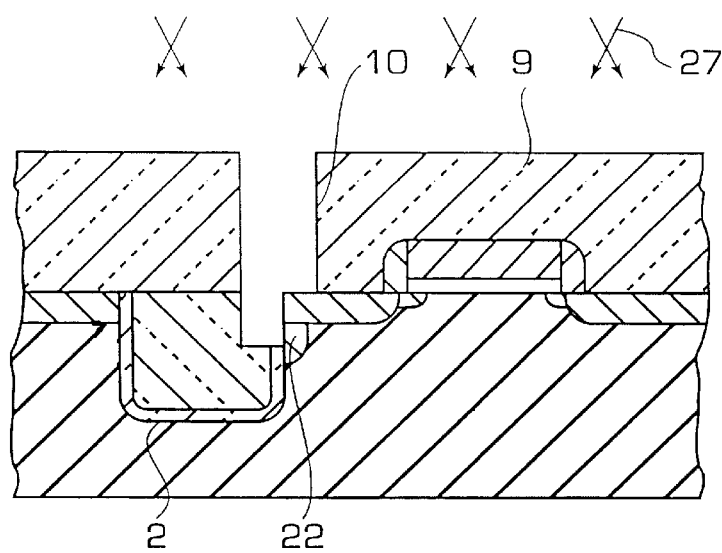
FIG. 10B is a sectional view showing a second manufacturing process of the N channel type MOS transistor of the semiconductor device according to the third embodiment of the present invention.
Figure 10C:
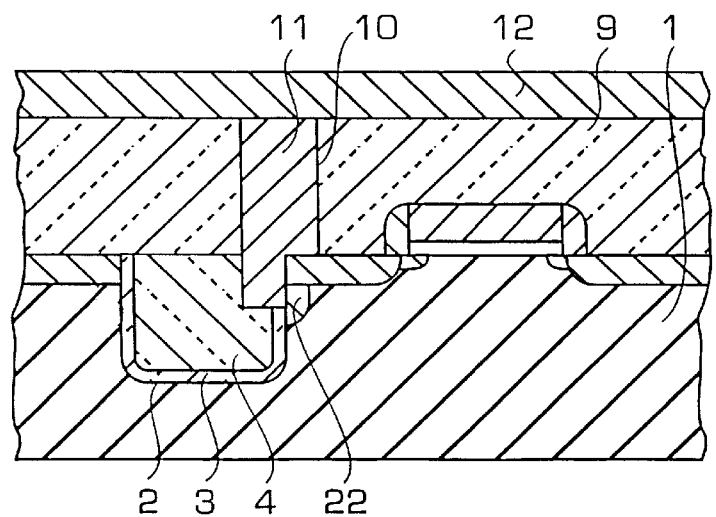
FIG. 10C is a sectional view showing a third manufacturing process of the N channel type MOS transistor of the semiconductor device according to the third embodiment of the present invention.

Next, a third embodiment of the present invention will be described with reference to FIGS. 10A to 10C. Now, a manufacturing process of the present invention will be described first. FIGS. 10A to 10C are sectional views showing the manufacturing process of an N channel type MOS transistor of a semiconductor device according to the third embodiment of the present invention. Here, the items same as those of the first or the second embodiment are represented with the same symbols.

First, according to the same method as that of the first embodiment, element separation trench 2 is formed in the prescribed region of silicon substrate 1 and then thermal oxidation film 3 and insulation film 4 are filled inside element separation trench 2. Gate insulation film 6 is also formed on the main surface of silicon substrate 1, then gate electrode 7 is formed on gate insulation film 6.

Then, as shown in FIG. 10A, in accordance with the normal manufacturing process of the MOS transistor, insulation film spacer 24 on the side of gate electrode 7 and high concentration impurity diffusion layer 8, 8a are formed after low concentration impurity diffusion layer 23 is formed.

Subsequently, as shown in FIG. 10B, interlayer insulation film 9 is deposited on all the surface by means of the CVD method. Then, after contact hole 10 is opened through interlayer insulation film 9, impurity ion 27 of arsenic or phosphorus is ion implanted by means of a rotational oblique ion implantation method with a relatively gradual incidence angle of 3 to 30 degrees.

When contact hole 10 partially overlaps with element separation trench 2 because of the positional misalignment taking place at the time of forming contact hole 10 and accordingly the insulation film inside element separation trench 2 is dug, low concentration impurity diffusion layer 22 is formed in the side wall of element separation trench 2 by impurities of arsenic or phosphorus obliquely implanted as above.

Finally, as shown in FIG. 10C, contact plug 11 is formed by filling conductive material such as tungsten inside contact hole 10, and wiring 12 which connects with contact plug 11 is laid on interlayer insulation film 9.

The MOS transistor comprising the trench element separation region is formed according to the manufacturing process described above, that is, thermal oxidation film 3 is formed in the inside wall of element separation trench 2 provided in the prescribed region of silicon substrate 1, and low concentration impurity diffusion layer 22 is formed through self positional alignment on the surface of exposed silicon substrate 1 in contact hole 10. Contact plug 11 connects with this low concentration impurity diffusion layer 22 and does not directly connect with silicon substrate 1.

As described above, no short circuit will be caused between silicon substrate 1 and wiring 12 by the N type diffusion layer formed on the side of element separation trench 2 by obliquely implanted arsenic or phosphorus. Also, in the same way as the second embodiment, since thermal stress produced in the silicon substrate can be reduced, crystal defects are scarcely produced.

In the above embodiments, it is described with reference to MOS transistors of the N channel type, but the present invention is similarly applicable to a P channel type MOS transistor. However, in this case, boron ions are used for oblique implantation of the impurity ions.

As described above, in the semiconductor device including the trench element separation structure provided in the prescribed region of the semiconductor substrate of the present invention, the inside wall of the trench is covered with the first insulation film, and then the second insulation film and the third insulation film are stacked in layers in this order and filled in the trench covered with the first insulation film. According to another embodiment of the present invention, in the semiconductor device including the trench element separation structure provided in the prescribed region of the semiconductor substrate of one conduction type, the inside wall of the trench is covered with the first insulation film, the second insulation film is filled in the trench covered with the first insulation film, and a diffusion layer of a reverse conduction type is formed on the semiconductor substrate in the side wall of the upper region of the trench.

Therefore, even when the contact hole is provided partially overlapping with the trench element separation region due to positional misalignment in the photolithograph process, short circuit between the contact plug to be filled in the contact hole or the wiring and the semiconductor substrate is perfectly prevented.

Further, since the semiconductor device is structured such that the cap insulation layer which serves as the third insulation film does not directly contact the semiconductor substrate, the thermal stress produced in the semiconductor substrate is reduced and generation of crystal defects is controlled.

In such a way as described above, it becomes possible to easily manufacture a semiconductor device which includes the trench element separation structure and adapted to a high degree of integration without suffering from crystal defects produced in the semiconductor substrate.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. An integrated-circuit isolation structure comprising:
   a semiconductor substrate of a conductivity type selected from the group consisting of n-type and p-type;
   a plurality of discrete devices, each discrete device having a portion formed in said semiconductor substrate adjacent to an isolation trench;
   said isolation trench, formed in the substrate between devices, comprising:
      a cavity formed in the substrate,
      a lining of insulating film, formed within said cavity, wherein said lining covers a bottom surface of said cavity and at least a lower portion of a lateral surface of said cavity,
      a filling insulator, formed within said cavity on said lining and at least partially filling said cavity, and
      an insulation film spacer, formed within said cavity on a portion of the lateral surface other than the portion covered by said lining;
   an interlayer insulating film, covering the devices and said isolation trench;
   a contact plug, comprising an opening portion in said interlayer insulating film selectively formed over a portion of a first discrete device of said plurality of discrete devices and filled with a conductive material, wherein said contact plug forms an electrical connection to said portion of said first discrete device, and wherein said portion of said first discrete device is adjacent to said isolation trench;
   a diffusion layer of a conductivity type other than that of the substrate, formed in the substrate along a lateral surface of said isolation trench, extending at least as far down the lateral surface as an upper edge of the adjacent lining, wherein said diffusion layer is formed at least beneath said portion of said first discrete device connected to said contact plug, extending up said lateral surface to a lower edge of said portion of said first discrete device; and
   a wiring layer, formed over said interlayer insulating film, and electrically connected to said contact plug,
      wherein said insulation film spacer covers said portion of the lateral surface of said cavity, from the upper edge of the lining to at least an upper edge of the adjacent diffusion layer, and
      wherein said diffusion layer has a lower concentration of impurities of the other than-said-substrate-conductivity type than said portion of said first discrete device above said diffusion layer.

2. An integrated-circuit isolation structure according to claim 1, wherein said lining and said filling insulator are formed to stop 100Å to 1000Å below a substrate upper surface.

3. An integrated-circuit isolation structure according to claim 1, wherein said diffusion layer is formed in the substrate along the lateral surface around the perimeter of said isolation trench.

4. An integrated-circuit structure according to claim 1, wherein said insulation film spacer extends along the lateral surface from the upper edge of the lining to an upper edge of said cavity.

5. An integrated-circuit structure according to claim 1, wherein said insulation film spacer is a layer along the lateral surface of said cavity, extending only marginally away from said lateral surface into said cavity.

6. An integrated-circuit isolation structure according to claim 1, wherein said contact plug forms the electrical connection to the semiconductor substrate only at an area associated with said portion of said first discrete device.

7. An integrated-circuit isolation structure comprising:
   a semiconductor substrate of a conductivity type selected from the group consisting of n-type and p-type;
   a plurality of discrete devices, each discrete device having a portion formed in said semiconductor substrate adjacent to an isolation trench;
   said isolation trench, formed in the substrate between devices, comprising:
      a cavity formed in the substrate,
      a lining of insulating film, formed within said cavity, wherein said lining covers a bottom surface of said cavity and at least a lower portion of a lateral surface of said cavity, and
      a filling insulator, formed within said cavity on said lining and at least partially filling said cavity;
   an interlayer insulating film, covering the devices and said isolation trench;
   a contact plug, comprising an opening portion in said interlayer insulating film selectively formed over a portion of a first discrete device of said plurality of discrete devices and filled with a conductive material, wherein said contact plug forms an electrical connection to said portion of said first discrete device, and wherein said portion of said first discrete device is adjacent to said isolation trench;
   a wiring layer, formed over said interlayer insulating film, and electrically connected to said contact plug; and
   a diffusion layer of a conductivity type other than that of the substrate, formed in the substrate along a lateral surface of said isolation trench, at least beneath said portion of said first discrete device connected to said contact plug, and extending up said lateral surface to a lower edge of said portion of said first discrete device, wherein said diffusion layer has a lower concentration of impurities of the other than-said-substrate-conductivity type than said portion of said first discrete device above said diffusion layer.

8. An integrated-circuit isolation structure according to clam 7, wherein said diffusion layer is formed in the substrate along the lateral surface around the perimeter of said isolation trench.

9. An integrated-circuit structure according to claim 7, wherein said lining and said filling insulator are formed to have upper surfaces substantially coplanar with a substrate upper surface.

10. An integrated-circuit isolation structure according to claim 7, wherein said contact plug forms the electrical connection to the semiconductor substrate only at an area associated with said portion of said first discrete device.

* * * * *